United States Patent
Chi et al.

(10) Patent No.: US 9,153,476 B2
(45) Date of Patent: Oct. 6, 2015

(54) SEMICONDUCTOR DEVICE AND METHOD OF FORMING PREFABRICATED MULTI-DIE LEADFRAME FOR ELECTRICAL INTERCONNECT OF STACKED SEMICONDUCTOR DIE

(71) Applicant: STATS ChipPAC, Ltd., Singapore (SG)

(72) Inventors: HeeJo Chi, Kyoungki-do (KR); YeongIm Park, Kyounggi-Do (KR); HyungMin Lee, Gyeonggi-Do (KR)

(73) Assignee: STATS ChipPAC, Ltd., Singapore (SG)

( * ) Notice: Subject to any disclaimer, the term of this patent is extended or adjusted under 35 U.S.C. 154(b) by 0 days.

(21) Appl. No.: 13/691,464

(22) Filed: Nov. 30, 2012

(65) Prior Publication Data

US 2013/0087898 A1    Apr. 11, 2013

Related U.S. Application Data

(63) Continuation of application No. 12/781,751, filed on May 17, 2010, now Pat. No. 8,357,564.

(51) Int. Cl.
*H01L 21/44* (2006.01)
*H01L 21/768* (2006.01)
(Continued)

(52) U.S. Cl.
CPC ...... *H01L 21/76802* (2013.01); *H01L 21/4832* (2013.01); *H01L 21/561* (2013.01); *H01L 21/568* (2013.01); *H01L 21/6835* (2013.01); *H01L 23/49517* (2013.01); *H01L 23/49527* (2013.01); *H01L 23/49541* (2013.01); *H01L 23/49575* (2013.01); *H01L 23/49816* (2013.01); *H01L 23/5389* (2013.01); *H01L 24/11* (2013.01); *H01L 24/19* (2013.01); *H01L 24/20* (2013.01); *H01L 24/97* (2013.01); *H01L 25/0657* (2013.01); *H01L 23/295* (2013.01); *H01L 23/3107* (2013.01); *H01L 23/3128* (2013.01); *H01L 23/49537* (2013.01); *H01L 24/05* (2013.01); *H01L 24/13* (2013.01); *H01L 24/16* (2013.01); *H01L 24/29* (2013.01); *H01L 24/32* (2013.01); *H01L 24/48* (2013.01); *H01L 24/81* (2013.01); *H01L 24/83* (2013.01); *H01L 2221/68363* (2013.01); *H01L 2221/68381* (2013.01); *H01L 2221/68386* (2013.01); *H01L 2224/02379* (2013.01); *H01L 2224/0401* (2013.01); *H01L 2224/04042* (2013.01);
(Continued)

(58) Field of Classification Search
None
See application file for complete search history.

(56) References Cited

U.S. PATENT DOCUMENTS 5,250,843 A    10/1993   Eichelberger
5,353,498 A    10/1994   Fillion et al.
(Continued)

*Primary Examiner* — Kyoung Lee
(74) *Attorney, Agent, or Firm* — Robert D. Atkins; Patent Law Group: Atkins and Associates, P.C.

(57) ABSTRACT

A prefabricated multi-die leadframe having a plurality of contact pads is mounted over a temporary carrier. A first semiconductor die is mounted over the carrier between the contact pads of the leadframe. A second semiconductor die is mounted over the contact pads of the leadframe and over the first die. An encapsulant is deposited over the leadframe and first and second die. The carrier is removed. A first interconnect structure is formed over the leadframe and the first die and a first surface of the encapsulant. A channel is cut through the encapsulant and leadframe to separate the contact pads. A plurality of conductive vias can be formed through the encapsulant. A second interconnect structure is formed over a second surface of the encapsulant opposite the first surface of the encapsulant. The second interconnect structure is electrically connected to the conductive vias.

25 Claims, 12 Drawing Sheets

(51) Int. Cl.
    *H01L 21/48*              (2006.01)
    *H01L 21/56*              (2006.01)
    *H01L 21/683*           (2006.01)
    *H01L 23/495*           (2006.01)
    *H01L 23/498*           (2006.01)
    *H01L 23/538*           (2006.01)
    *H01L 25/065*           (2006.01)
    *H01L 23/29*             (2006.01)
    *H01L 23/31*             (2006.01)
    *H01L 23/00*             (2006.01)
    *H05K 1/18*              (2006.01)
    *H05K 3/46*              (2006.01)

(52) U.S. Cl.
CPC ............ *H01L2224/04105* (2013.01); *H01L 2224/05548* (2013.01); *H01L 2224/05611* (2013.01); *H01L 2224/05624* (2013.01); *H01L 2224/05639* (2013.01); *H01L 2224/05644* (2013.01); *H01L 2224/05647* (2013.01); *H01L 2224/05655* (2013.01); *H01L 2224/11002* (2013.01); *H01L 2224/1132* (2013.01); *H01L 2224/1145* (2013.01); *H01L 2224/11334* (2013.01); *H01L 2224/11462* (2013.01); *H01L 2224/11464* (2013.01); *H01L 2224/11849* (2013.01); *H01L 2224/11901* (2013.01); *H01L 2224/12105* (2013.01); *H01L 2224/131* (2013.01); *H01L 2224/13024* (2013.01); *H01L 2224/13111* (2013.01); *H01L 2224/13113* (2013.01); *H01L 2224/13116* (2013.01); *H01L 2224/13124* (2013.01); *H01L 2224/13139* (2013.01); *H01L 2224/13144* (2013.01); *H01L 2224/13147* (2013.01); *H01L 2224/13155* (2013.01); *H01L 2224/16245* (2013.01); *H01L 2224/21* (2013.01); *H01L 2224/2105* (2013.01); *H01L 2224/215* (2013.01); *H01L 2224/22* (2013.01); *H01L 2224/221* (2013.01); *H01L 2224/2919* (2013.01); *H01L 2224/29144* (2013.01); *H01L 2224/32145* (2013.01); *H01L 2224/32225* (2013.01); *H01L 2224/48091* (2013.01); *H01L 2224/48105* (2013.01); *H01L 2224/48175* (2013.01); *H01L 2224/48227* (2013.01); *H01L 2224/48228* (2013.01); *H01L 2224/73265* (2013.01); *H01L 2224/8385* (2013.01); *H01L 2224/95001* (2013.01); *H01L 2224/97* (2013.01); *H01L 2225/06517* (2013.01); *H01L 2924/0103* (2013.01); *H01L 2924/01004* (2013.01); *H01L 2924/014* (2013.01); *H01L 2924/01013* (2013.01); *H01L 2924/01024* (2013.01); *H01L 2924/01029* (2013.01); *H01L 2924/01047* (2013.01); *H01L 2924/01073* (2013.01); *H01L 2924/01074* (2013.01); *H01L 2924/01078* (2013.01); *H01L 2924/01079* (2013.01); *H01L 2924/01082* (2013.01); *H01L 2924/01322* (2013.01); *H01L 2924/09701* (2013.01); *H01L 2924/12041* (2013.01); *H01L 2924/1306* (2013.01); *H01L 2924/13091* (2013.01); *H01L 2924/15311* (2013.01); *H05K 1/185* (2013.01); *H05K 3/4682* (2013.01)

(56) References Cited

U.S. PATENT DOCUMENTS

| | | | | |
|---|---|---|---|---|
| 5,821,457 | A * | 10/1998 | Mosley et al. | 361/734 |
| 5,841,193 | A | 11/1998 | Eichelberger | |
| 6,239,487 | B1 * | 5/2001 | Park et al. | 257/712 |
| 6,340,842 | B1 * | 1/2002 | Nakamura | 257/724 |
| 6,512,302 | B2 * | 1/2003 | Mess et al. | 257/777 |
| 6,538,322 | B2 * | 3/2003 | Nakamura | 257/723 |
| 7,102,208 | B1 * | 9/2006 | Lee et al. | 257/666 |
| 7,288,835 | B2 * | 10/2007 | Yim et al. | 257/685 |
| 7,619,901 | B2 | 11/2009 | Eichelberger et al. | |
| 2002/0140085 | A1 * | 10/2002 | Lee et al. | 257/724 |
| 2003/0230801 | A1 * | 12/2003 | Jiang et al. | 257/723 |
| 2004/0106229 | A1 * | 6/2004 | Jiang et al. | 438/106 |
| 2009/0127686 | A1 | 5/2009 | Yang et al. | |
| 2009/0140442 | A1 | 6/2009 | Lin | |
| 2009/0162957 | A1 * | 6/2009 | Joung | 438/27 |
| 2010/0006994 | A1 | 1/2010 | Shim et al. | |

* cited by examiner

SEMICONDUCTOR DEVICE AND METHOD OF FORMING PREFABRICATED MULTI-DIE LEADFRAME FOR ELECTRICAL INTERCONNECT OF STACKED SEMICONDUCTOR DIE

CLAIM TO DOMESTIC PRIORITY

The present application is a continuation of U.S. patent application Ser. No. 12/781,751, now U.S. Pat. No. 8,357,564, filed May 17, 2010, which application is incorporated herein by reference.

FIELD OF THE INVENTION

The present invention relates in general to semiconductor devices and, more particularly, to a semiconductor device and method of forming a prefabricated multi-die leadframe for electrical interconnect of stacked semiconductor die.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions, such as high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is typically identical and contains circuits formed by electrically connecting active and passive components. Back-end manufacturing involves singulating individual die from the finished wafer and packaging the die to provide structural support and environmental isolation.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller die size may be achieved by improvements in the front-end process resulting in die with smaller, higher density active and passive components. Back-end processes may result in semiconductor device packages with a smaller footprint by improvements in electrical interconnection and packaging materials.

The electrical interconnection in a fan-out wafer level chip scale package (FO-WLCSP) containing semiconductor die stacked on multiple levels can be accomplished with conductive through silicon vias (TSV), through hole vias (THV), and Cu-plated conductive pillars. Vias are formed in silicon or organic material around the die using mechanical drilling, laser drilling, or deep reactive ion etching (DRIE). The vias are filled with conductive material, for example by copper deposition using an electroplating process, to form the conductive TSVs and THVs. The TSVs and THVs further connect through build-up interconnect structures which are formed across each semiconductor die.

FIG. 1 shows a conventional FO-WLCSP 10 with semiconductor die 12 covered by encapsulant 14. A plurality of conductive pillars or vias 16 is formed through encapsulant 14 by mechanical drilling, laser drilling, or DRIE. A build-up interconnect structure 18 with bumps 19 is formed over the active surface of semiconductor die 12 and a first surface of encapsulant 14. An interconnect structure 20 is formed over a second surface of encapsulant 14, opposite the first surface of the encapsulant. The interconnect structure 20 is electrically connected to conductive vias 16. A semiconductor die 22 is mounted to interconnect structure 18 with bumps 24. An encapsulant 26 is deposited over semiconductor die 22 and interconnect structure 20. Semiconductor die 22 is electrically connected through bumps 24, interconnect structure 20, and conductive vias 16 to interconnect structure 18 and semiconductor die 12.

FIG. 2 shows another conventional FO-WLCSP 28 with a back surface of semiconductor die 30 mounted to a back surface of semiconductor die 32 using adhesive 33. The stacked semiconductor die 30 and 32 are covered by encapsulant 34. A plurality of conductive pillars or vias 35 and 36 is formed through encapsulant 34 by mechanical drilling, laser drilling, or DRIE. An interconnect structure 38 with bumps 39 is formed over the active surface of semiconductor die 32 and a first surface of encapsulant 34. The interconnect structure 38 is electrically connected to conductive vias 35. An interconnect structure 40 is formed over a second surface of encapsulant 34, opposite the first surface of the encapsulant. The interconnect structure 40 is electrically connected to conductive vias 35 and 36. Semiconductor die 30 is electrically connected through conductive vias 36, interconnect structure 40, and conductive vias 35 to interconnect structure 38 and semiconductor die 32.

FIG. 3 shows another conventional FO-WLCSP 41 with an active surface of semiconductor die 42 mounted to a back surface of semiconductor die 43 with an adhesive or insulating interposer 44. The stacked semiconductor die 42 and 43 are covered by encapsulant 45. A plurality of conductive pillars or vias 46 is formed through encapsulant 45 by mechanical drilling, laser drilling, or DRIE. An interconnect structure 48 with bumps 49 is formed over the active surface of semiconductor die 43 and a surface of encapsulant 45. The interconnect structure 48 is electrically connected to conductive vias 46. Semiconductor die 42 is electrically connected through conductive vias 46 to interconnect structure 48 and semiconductor die 43.

Each of the semiconductor package arrangements described in FIGS. 1-3 requires deep via formation and single or dual interconnect structures for routing signals between the stacked semiconductor die. The formation of deep vias by mechanical drilling, laser drilling, or DRIE is an expensive manufacturing step, which requires specialized equipment. In addition, the semiconductor package arrangements of FIGS. 1-3 often require fine top die placement, deeply embedded in encapsulant, which adds cost to the manufacturing process.

SUMMARY OF THE INVENTION

A need exists to electrically interconnect stacked semiconductor die without necessarily forming deep vias through the encapsulant. Accordingly, in one embodiment, the present invention is a method of making a semiconductor device comprising the steps of providing a substrate including a plurality of contact pads extending laterally from the substrate, disposing a first semiconductor die between the contact pads of the substrate, disposing a second semiconductor die over the contact pads and first semiconductor die, depositing an encapsulant over the substrate and second semiconductor die, and forming a first interconnect structure over the contact pads and first semiconductor die.

In another embodiment, the present invention is a method of making a semiconductor device comprising the steps of providing a substrate including a plurality of conductive fingers extending from the substrate, disposing a first semiconductor die between the conductive fingers of the substrate, and disposing a second semiconductor die over the conductive fingers.

In another embodiment, the present invention is a method of making a semiconductor device comprising the steps of providing a plurality of conductive fingers, disposing a first semiconductor die between the conductive fingers, and disposing a second semiconductor die over the conductive fingers pads.

In another embodiment, the present invention is a semiconductor device comprising a plurality of conductive fingers and first semiconductor die disposed between the conductive fingers. A second semiconductor die is disposed over the conductive fingers pads.

DETAILED DESCRIPTION OF THE DRAWINGS

Figure 1:
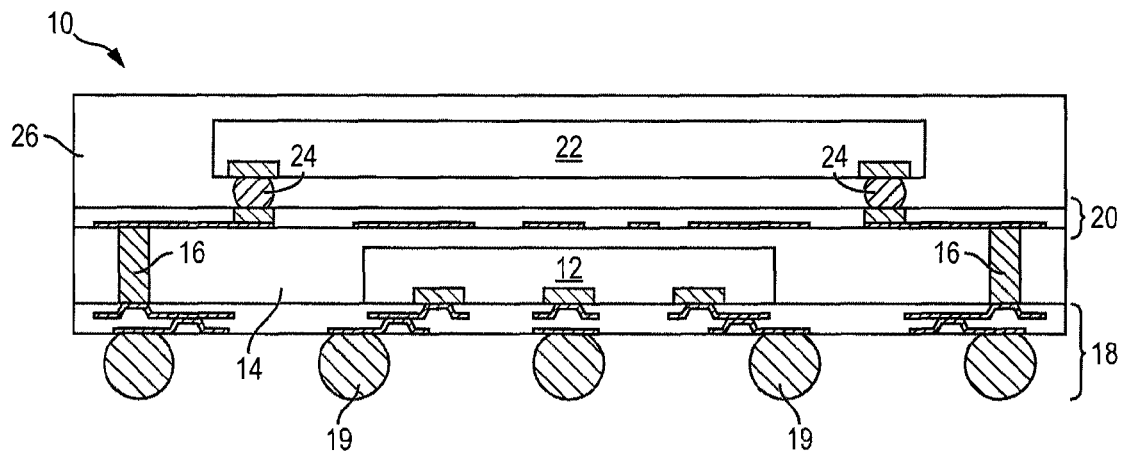
FIG. 1 illustrates a conventional FO-WLCSP containing stacked semiconductor die with dual interconnect structures and deep conductive vias formed through the encapsulant.
Figure 2:
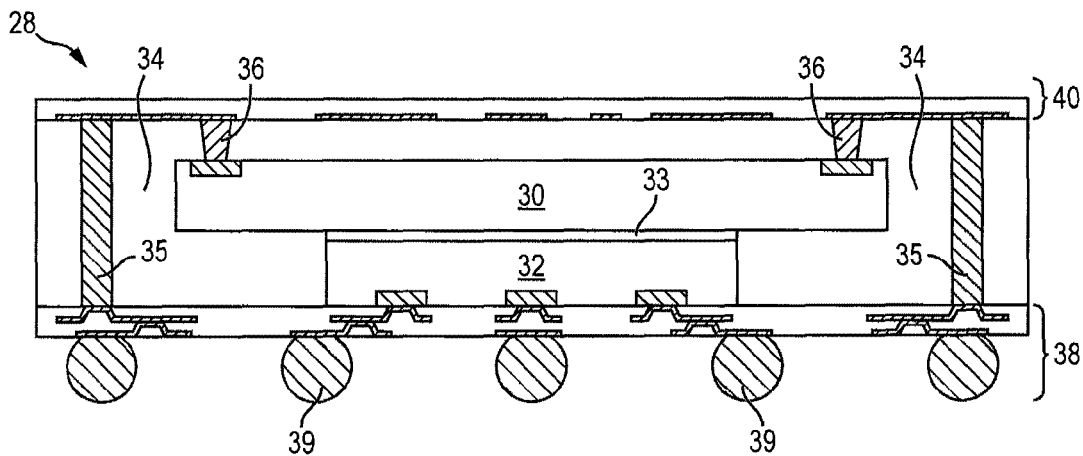
FIG. 2 illustrates another conventional FO-WLCSP containing stacked semiconductor die with dual interconnect structures and deep conductive vias through the encapsulant.
Figure 3:
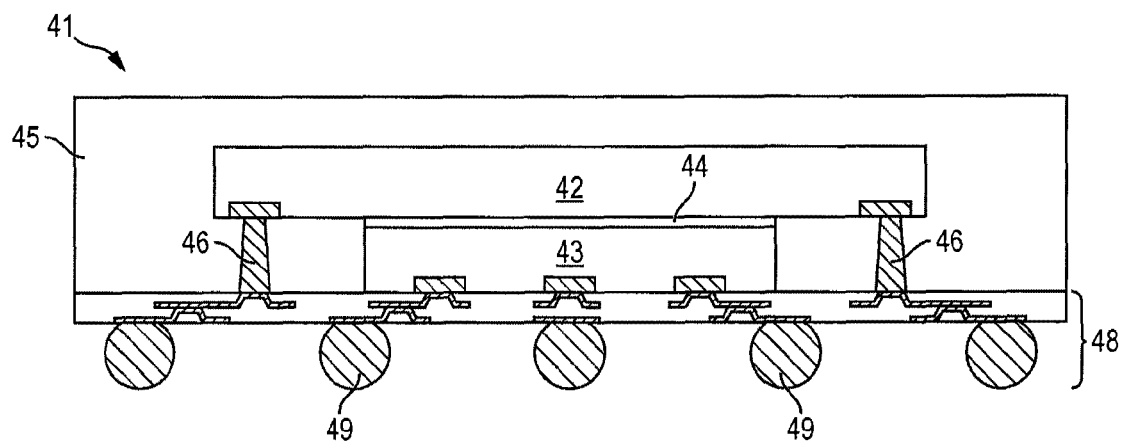
FIG. 3 illustrates another conventional FO-WLCSP containing stacked semiconductor die with a single interconnect structure and deep conductive vias through the encapsulant.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition may involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. The portion of the photoresist pattern subjected to light is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. The wafer is singulated using a laser cutting tool or saw blade. After singulation, the individual die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

Figure 4:
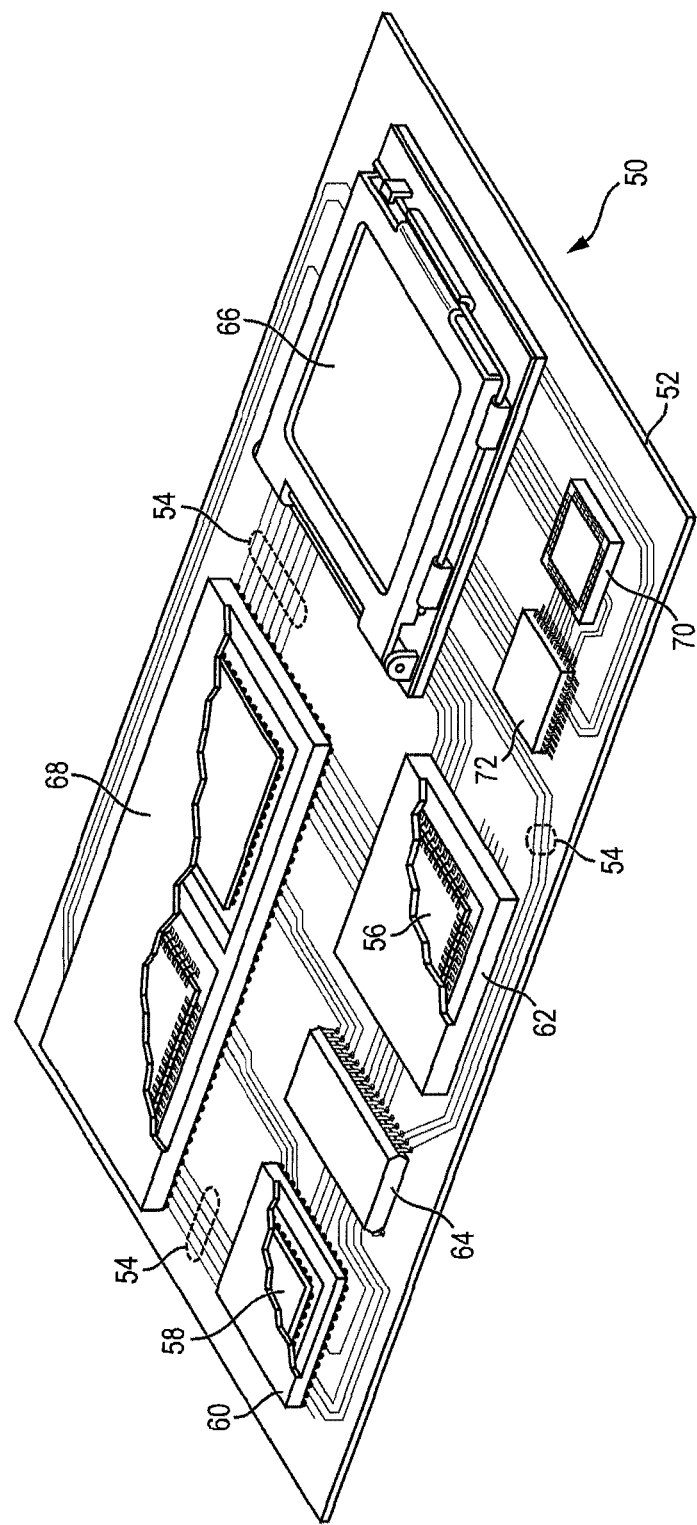
FIG. 4 illustrates a PCB with different types of packages mounted to its surface.

FIG. 4 illustrates electronic device 50 having a chip carrier substrate or printed circuit board (PCB) 52 with a plurality of semiconductor packages mounted on its surface. Electronic device 50 may have one type of semiconductor package, or multiple types of semiconductor packages, depending on the application. The different types of semiconductor packages are shown in FIG. 4 for purposes of illustration.

Electronic device 50 may be a stand-alone system that uses the semiconductor packages to perform one or more electrical functions. Alternatively, electronic device 50 may be a subcomponent of a larger system. For example, electronic device 50 may be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components.

In FIG. 4, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including wire bond package 56 and flip chip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a streamlined manufacturing process. The resulting devices are less likely to fail and less expensive to manufacture resulting in a lower cost for consumers.

Figure 5A:
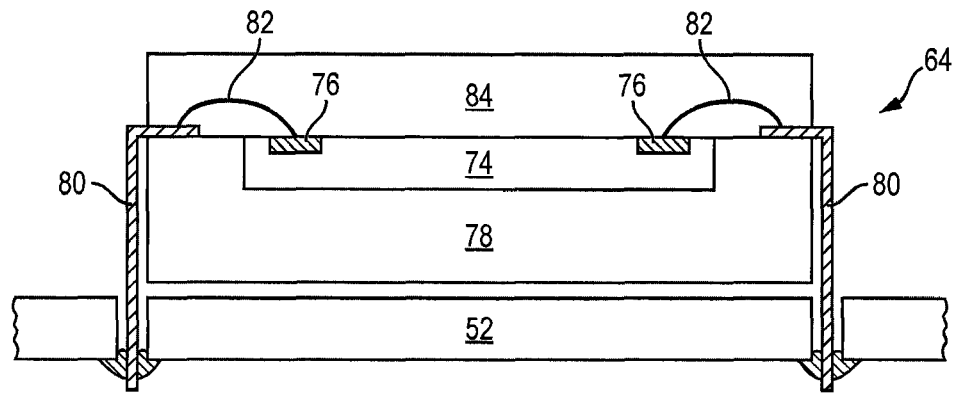
FIGS. 5a-5c illustrate further detail of the representative semiconductor packages mounted to the PCB.
Figure 5B:
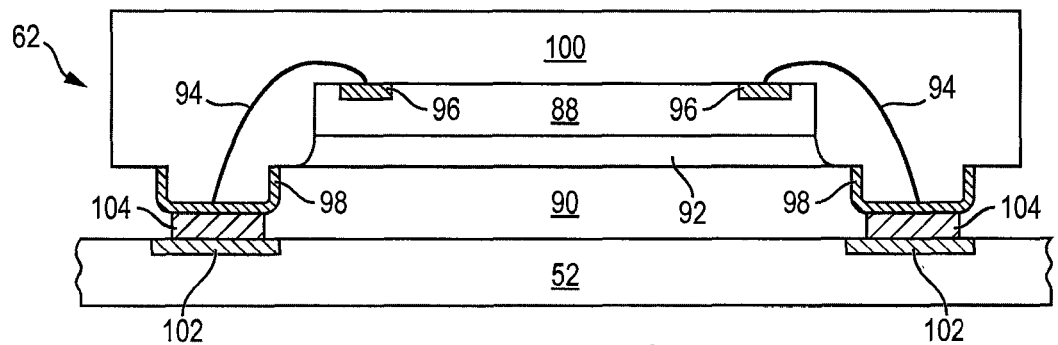
Figure 5C:
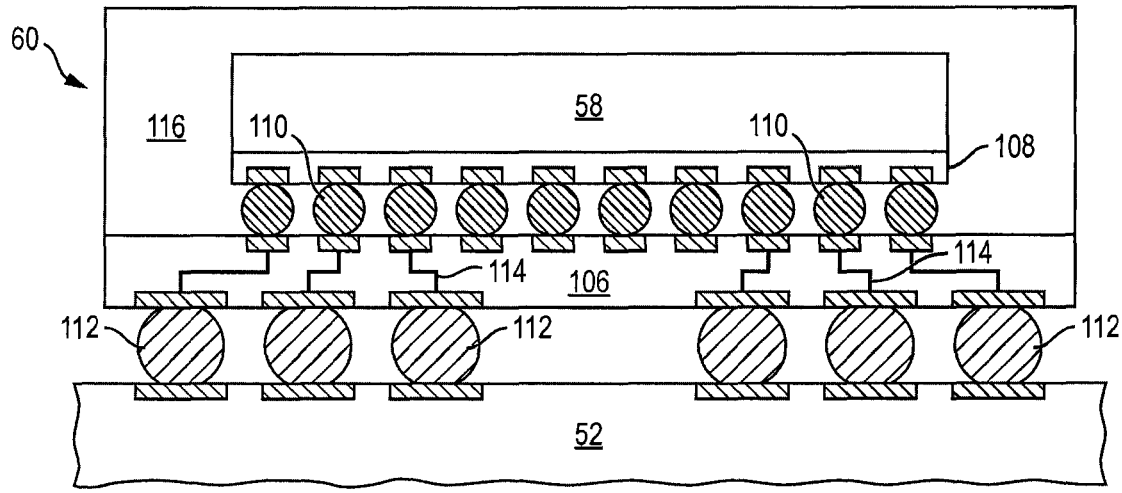

FIGS. 5a-5c show exemplary semiconductor packages. FIG. 5a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit may include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy. The package body includes an insulative packaging material such as polymer or ceramic. Conductor leads 80 and wire bonds 82 provide electrical interconnect between semiconductor die 74 and PCB 52. Encapsulant 84 is deposited over the package for environmental protection by preventing moisture and particles from entering the package and contaminating die 74 or wire bonds 82.

FIG. 5b illustrates further detail of BCC 62 mounted on PCB 52. Semiconductor die 88 is mounted over carrier 90 using an underfill or epoxy-resin adhesive material 92. Wire bonds 94 provide first level packing interconnect between contact pads 96 and 98. Molding compound or encapsulant 100 is deposited over semiconductor die 88 and wire bonds 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 5c, semiconductor die 58 is mounted face down to intermediate carrier 106 with a flip chip style first level packaging. Active region 108 of semiconductor die 58 contains analog or digital circuits implemented as active devices, passive devices, conductive layers, and dielectric layers formed according to the electrical design of the die. For example, the circuit may include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flip chip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flip chip style first level packaging without intermediate carrier 106.

Figure 6A:
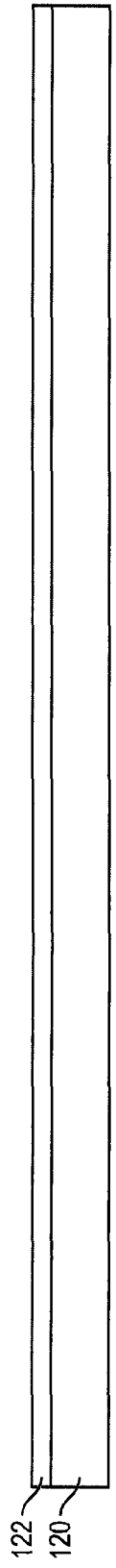
FIGS. 6a-6p illustrate a process of forming a prefabricated multi-die leadframe for electrical interconnect of stacked semiconductor die.
Figure 6C:
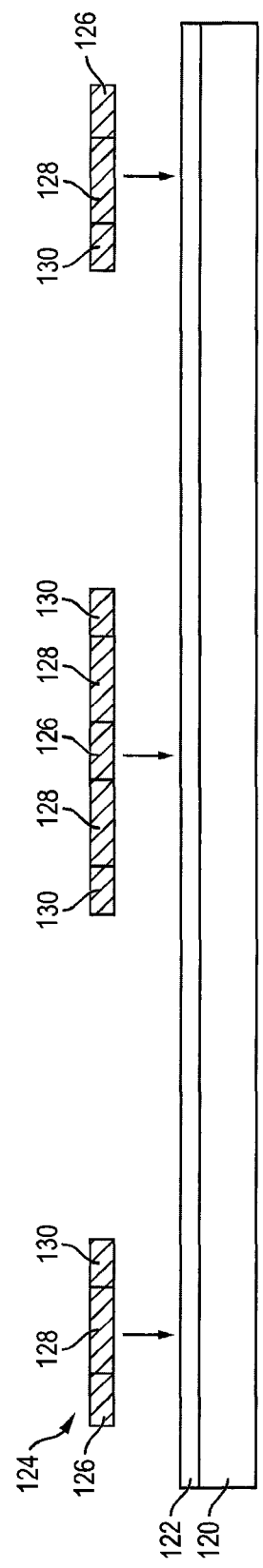
Figure 6D:
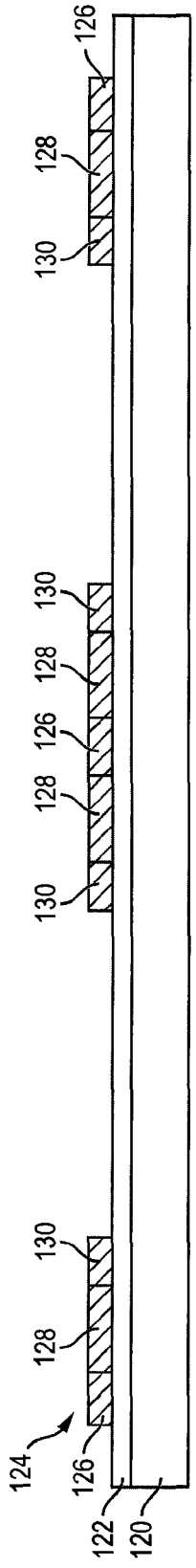
Figure 6E:
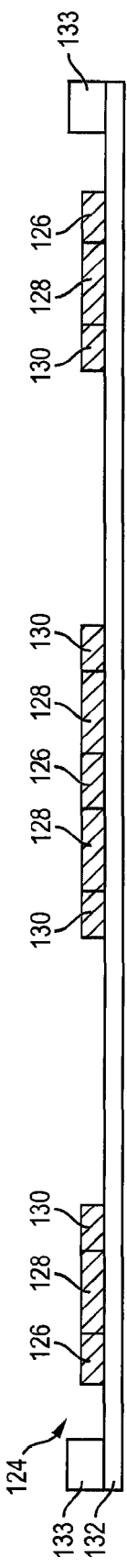
Figure 6B:
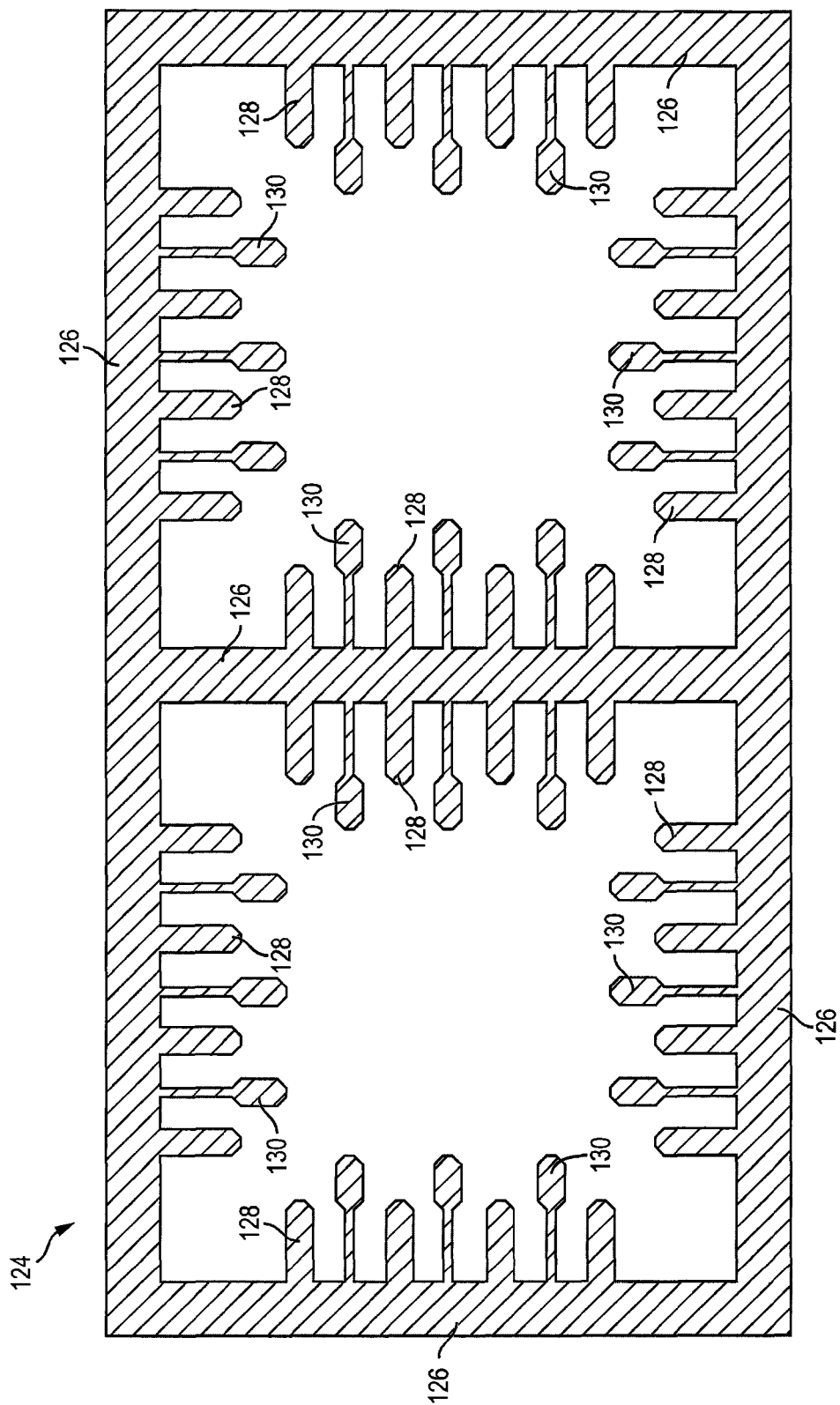
Figure 6F:
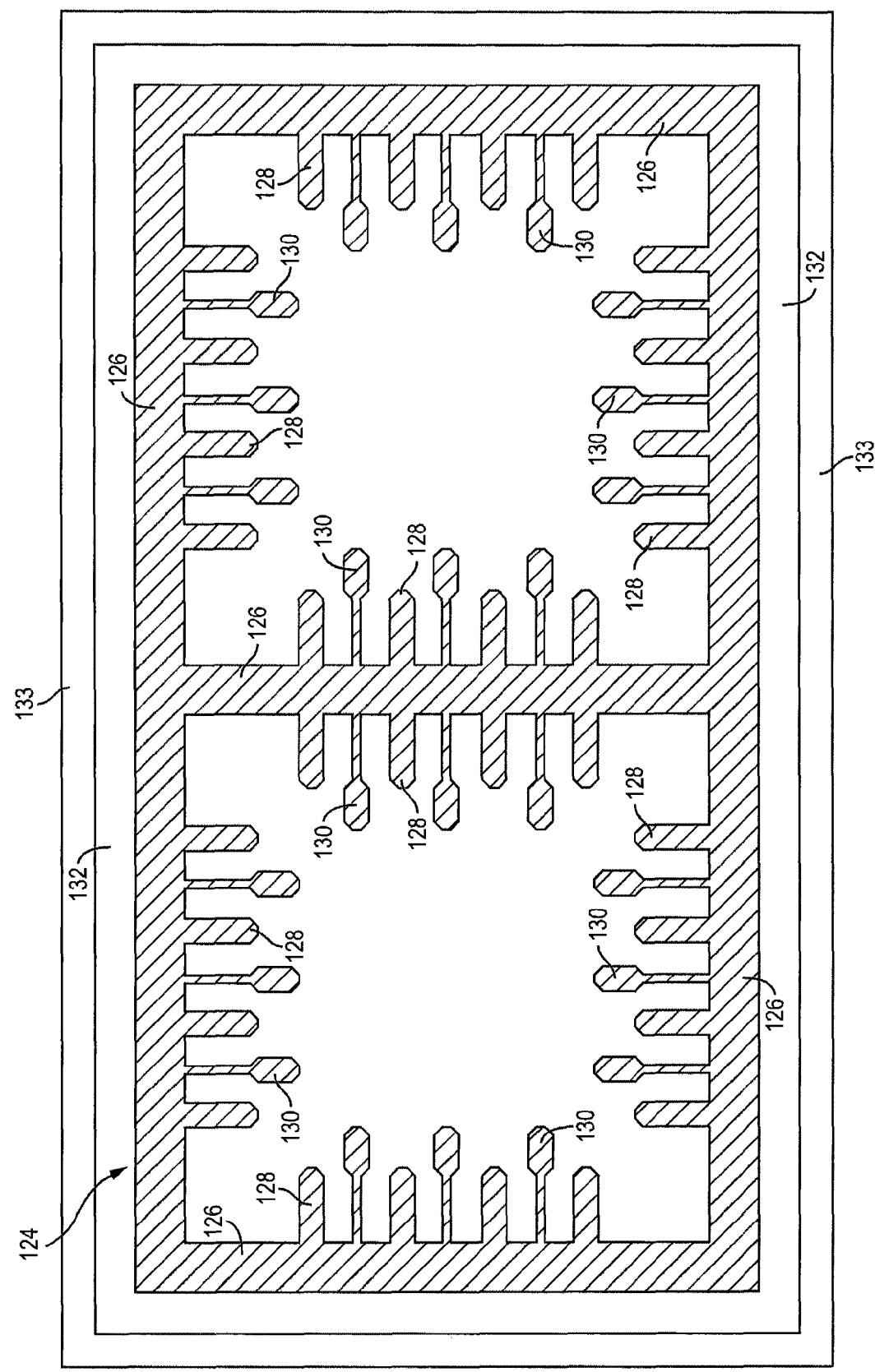
Figure 6G:
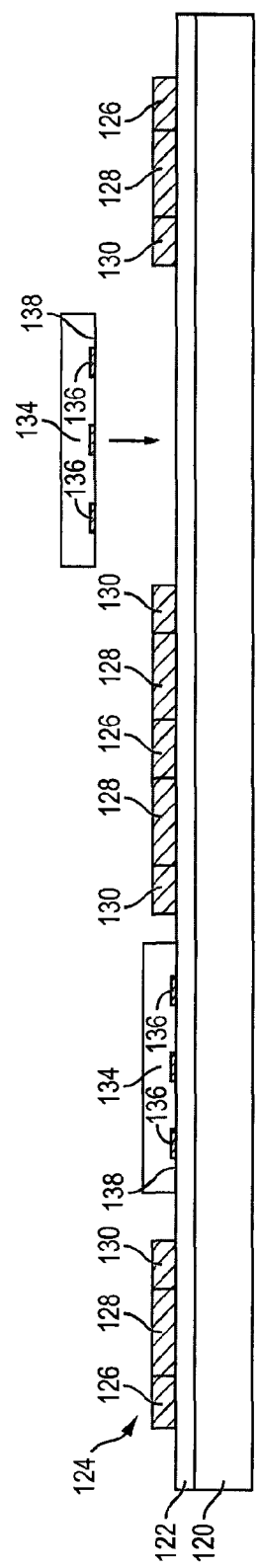
Figure 6H:
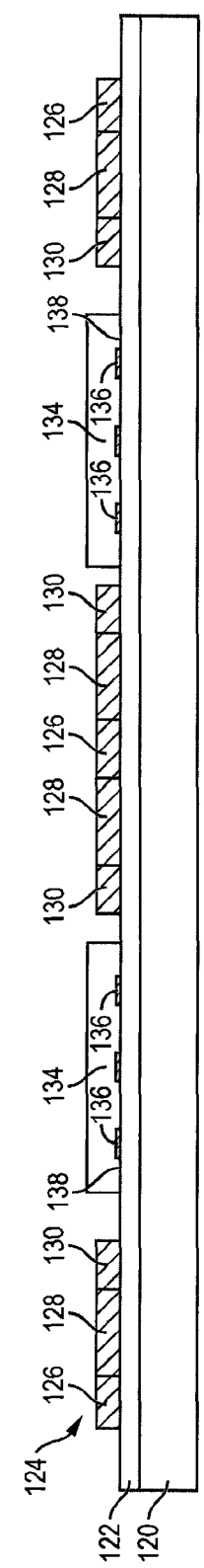
Figure 6J:
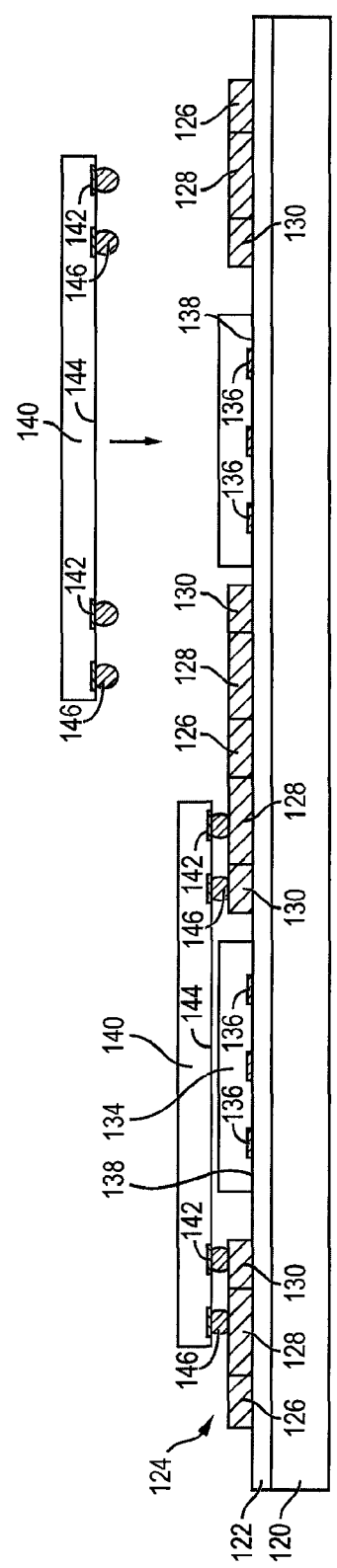
Figure 6I:
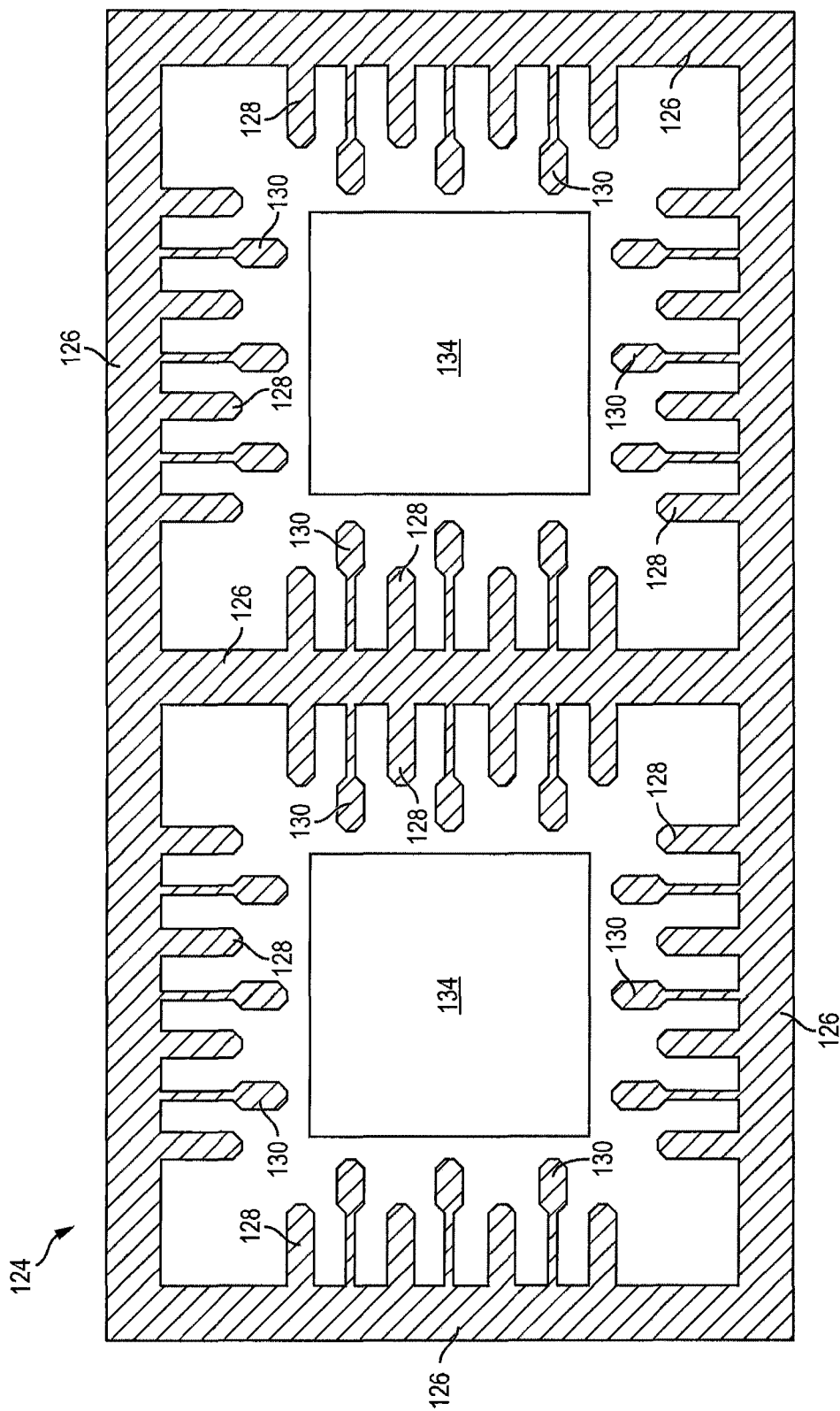
Figure 6K:
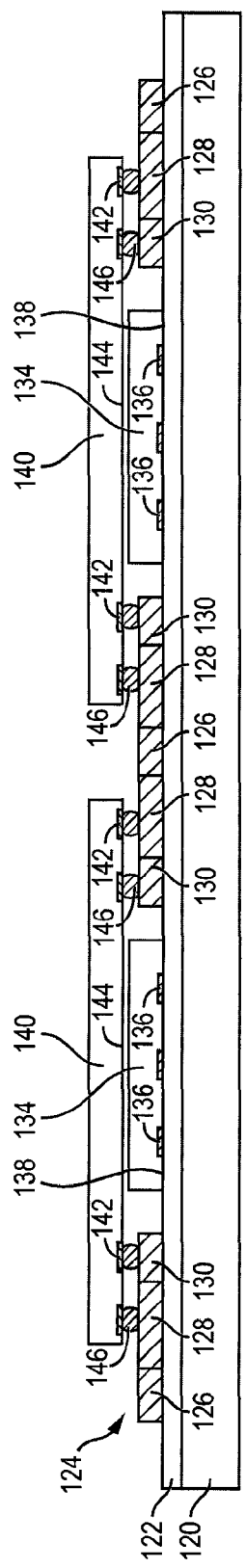
Figure 6L:
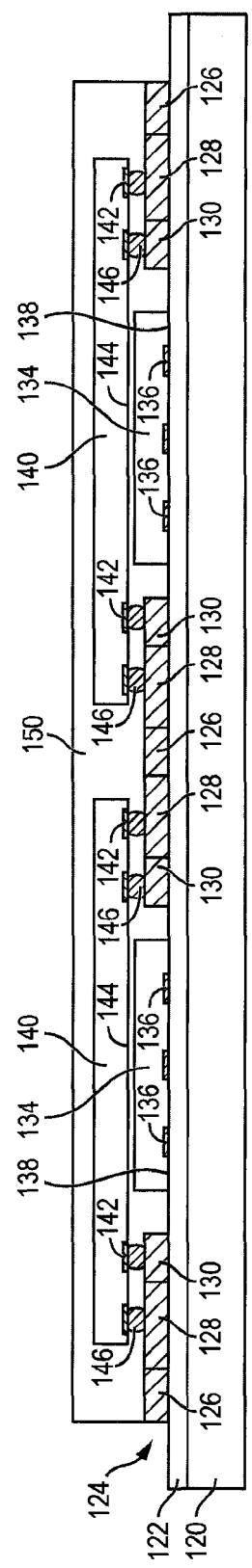
Figure 6M:
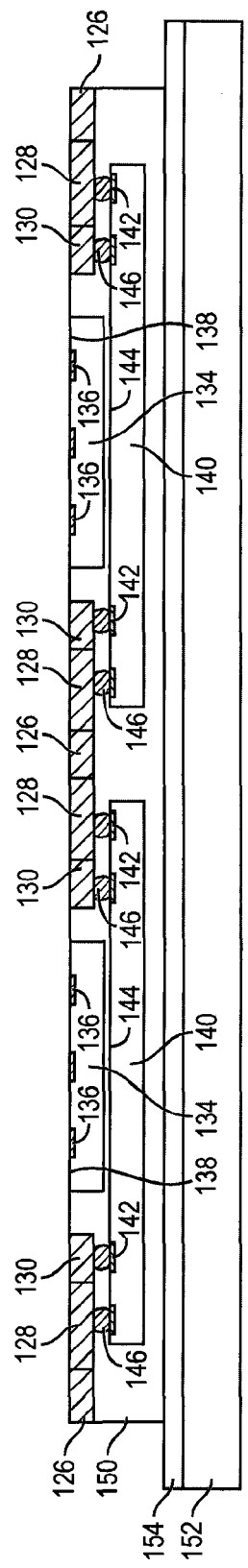
Figure 6N:
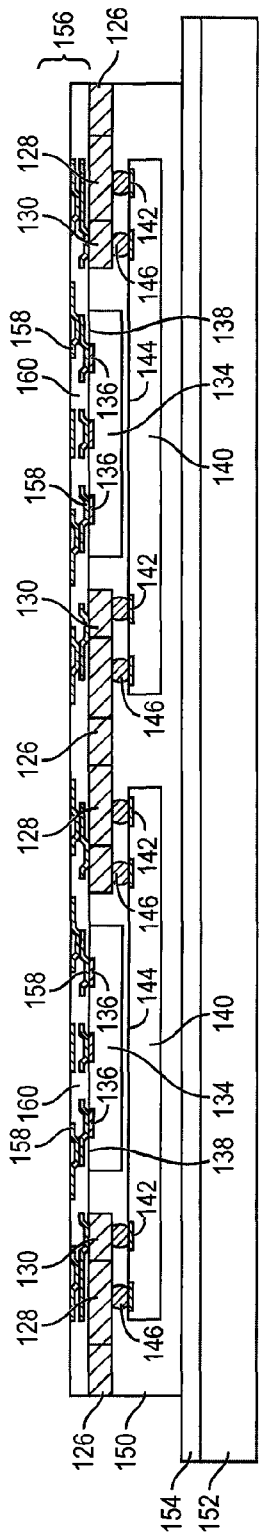
Figure 6O:
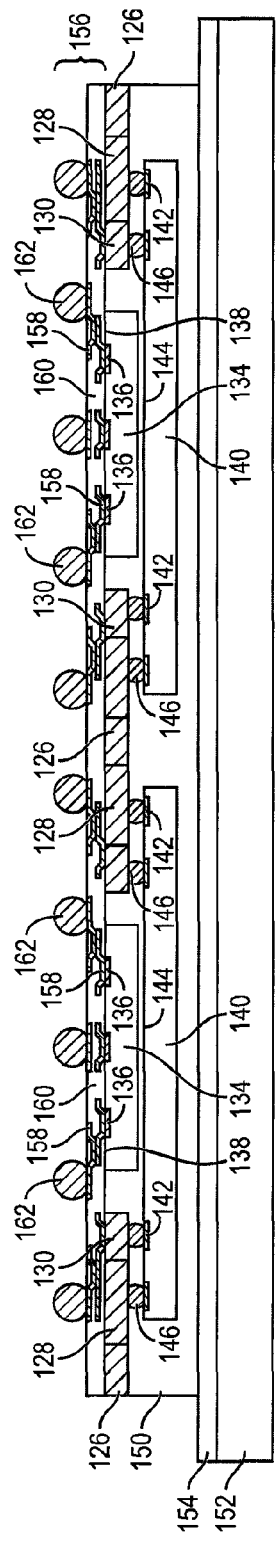
Figure 6P:
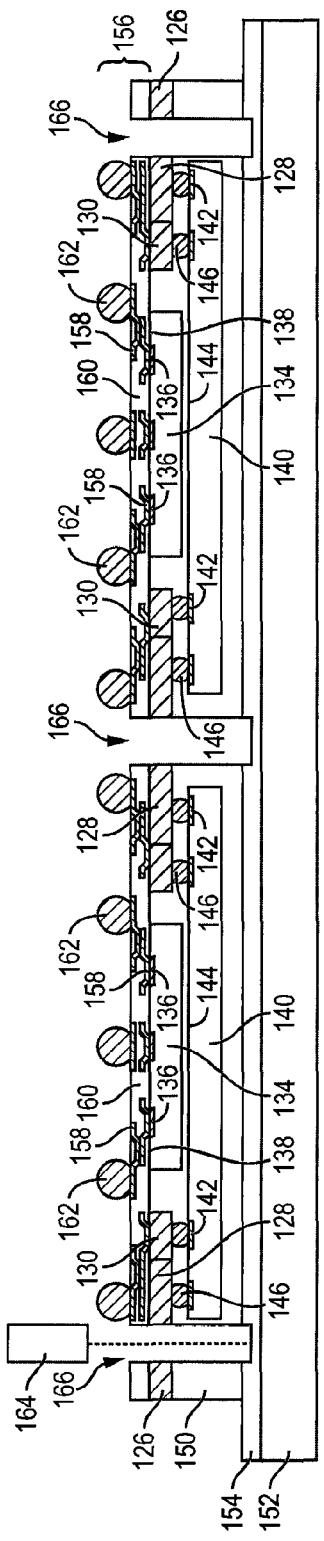

FIGS. 6a-6p illustrate, in relation to FIGS. 4 and 5a-5c, a process of forming a prefabricated multi-die leadframe for electrical interconnect of stacked semiconductor die. In FIG. 6a, a temporary substrate or carrier 120 contains sacrificial base material such as silicon, polymer, polymer composite, metal, ceramic, glass, glass epoxy, beryllium oxide, or other suitable low-cost, rigid material or bulk semiconductor material for structural support. An optional interface layer 122 can be formed over carrier 120 as a temporary adhesive bonding film or etch-stop layer.

FIG. 6b shows a top view of a multi-die metal leadframe 124 adapted for receiving semiconductor die. The semiconductor die are attached to leadframe 124 for structural support and electrical interconnection. In one embodiment, leadframe 124 is an un-singulated flat pre-molded or prefabricated laminated substrate. Leadframe 124 includes a dambar structure 126 around a perimeter of the leadframe with a plurality of integrated fingers or contact pads 128 and 130 arranged in dual rows. The row of contact pads 128 and row of contact pads 130 have different lengths extending from dambar 126 and are offset to increase packing density. Leadframe 124 is made with gold, silver, nickel, platinum, copper, copper alloys (including one or more elements of nickel, iron, zinc, tin, chromium, silver, and phosphorous), or other suitable materials. The dambar structure 126 is removed in a subsequent manufacturing step.

FIGS. 6c and 6d show a cross-sectional view of leadframe 124 positioned over and mounted to interface layer 122 of carrier 120.

In an alternate embodiment, leadframe 124 is mounted to tape 132 surrounded by carrier frame 133, as shown in FIG. 6e as a cross-sectional view. FIG. 6f is a top view of leadframe 124 mounted to tape 132 surrounded by carrier frame 133.

Continuing from FIGS. 6c-6d, semiconductor die or components 134 are mounted to interface layer 122, between contact pads 128 and 130 of leadframe 124, with contact pads 136 formed over active surface 138 oriented downward toward carrier 120, as shown in FIG. 6g. Active surface 138 contains analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 138 to implement analog circuits or digital circuits, such as digital signal processing (DSP), ASIC, memory, or other signal processing circuit. Semiconductor die 134 may also contain IPDs, such as inductors, capacitors, and resistors, for RF signal processing. In one embodiment, semiconductor die 134 is a flipchip type semiconductor die. FIG. 6h shows all semiconductor die 134 mounted to interface layer 122 of carrier 120, between contact pads 128 and 130 of leadframe 124. FIG. 6i shows a top view of semiconductor die 134 mounted to interface layer 122 of carrier 120, between contact pads 128 and 130 of leadframe 124.

In FIG. 6j, semiconductor die or components 140 are positioned over and mounted to leadframe 124, over semiconductor die 134, with contact pads 142 formed over active surface 144 oriented downward toward carrier 120. Active surface 144 contains analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 144 to implement analog circuits or digital circuits, such as DSP, ASIC, memory, or other signal processing circuit. Semiconductor die 140 may also contain IPDs, such as inductors, capacitors, and resistors, for RF signal processing. In one embodiment, semiconductor die 140 is a flipchip type semiconductor die. A plurality of bumps 146 is formed over contact pads 142 of semiconductor die 140 and electrically connected to contact pads 128 and 130 of leadframe 124. FIG. 6k shows all semiconductor die 140 mounted to leadframe 124 over semiconductor die 134.

In FIG. 6l, an encapsulant or molding compound 150 is deposited over carrier 120 and semiconductor die 134 and 140 using a paste printing, compressive molding, transfer molding, liquid encapsulant molding, vacuum lamination, spin coating, or other suitable applicator. Encapsulant 150 can be polymer composite material, such as epoxy resin with filler, epoxy acrylate with filler, or polymer with proper filler. Encapsulant 150 is non-conductive and environmentally protects the semiconductor device from external elements and contaminants.

In FIG. 6m, the structure described in FIGS. 6a-6l is inverted and another temporary carrier 152 and optional interface layer 154, similar to carrier 120 and interface layer 122, are mounted to the surface of encapsulant 150 opposite carrier 120. The temporary carrier 120 and optional interface layer 122 are then removed by chemical etching, mechanical peel-off, CMP, mechanical grinding, thermal bake, laser scanning, or wet stripping.

In FIG. 6n, an interconnect structure 156 is formed over leadframe 124, encapsulant 150, and active surface 138 of semiconductor die 134. The build-up interconnect structure 156 includes an electrically conductive layer or redistribution layer (RDL) 158 formed using a patterning and metal deposition process such as sputtering, electrolytic plating, and electroless plating. Conductive layer 158 can be one or more layers of Al, Cu, Sn, Ni, Au, Ag, or other suitable electrically conductive material. One portion of conductive layer 158 is electrically connected to contact pads 136 of semiconductor die 134. Another portion of conductive layer 158 is electrically connected to contact pads 128 and 130. Other portions of conductive layer 158 can be electrically common or electrically isolated depending on the design and function of semiconductor die 134 and 140.

The build-up interconnect structure 156 further includes an insulating or passivation layer 160 formed between conductive layers 158 for electrical isolation. The insulating layer 160 contains one or more layers of silicon dioxide (SiO2), silicon nitride (Si3N4), silicon oxynitride (SiON), tantalum pentoxide (Ta2O5), aluminum oxide (Al2O3), or other material having similar insulating and structural properties. The insulating layer 160 is formed using PVD, CVD, printing, spin coating, spray coating, sintering or thermal oxidation.

In FIG. 6o, an electrically conductive bump material is deposited over build-up interconnect structure 156 and electrically connected to conductive layer 158 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 158 using a suitable attachment or bonding process. In one embodiment, the bump material is reflowed by heating the material above its melting point to form spherical balls or bumps 162. In some applications, bumps 162 are reflowed a second time to improve electrical contact to conductive layer 158. An under bump metallization (UBM) can be formed under bumps 162. The bumps can also be compression bonded to conductive layer 158. Bumps 162 represent one type of interconnect structure that can be formed over conductive layer 158. The interconnect structure can also use bond wires, stud bump, micro bump, or other electrical interconnect.

In FIG. 6p, channels 166 are cut between one set of stacked semiconductor die 134 and 140 and an adjacent set of stacked semiconductor die 134 and 140 using saw blade or laser cutting tool 164 to cut channels 166. Channels 166 also cut through dambar 126 of leadframe 124 to separate contact pads 128 and 130 from the dambar. Channels 166 extend down to interface layer 154. The temporary carrier 152 and optional interface layer 154 are removed by chemical etching, mechanical peel-off, CMP, mechanical grinding, thermal bake, laser scanning, or wet stripping to singulate the sets of stacked semiconductor die 134 and 140.

Figure 7:
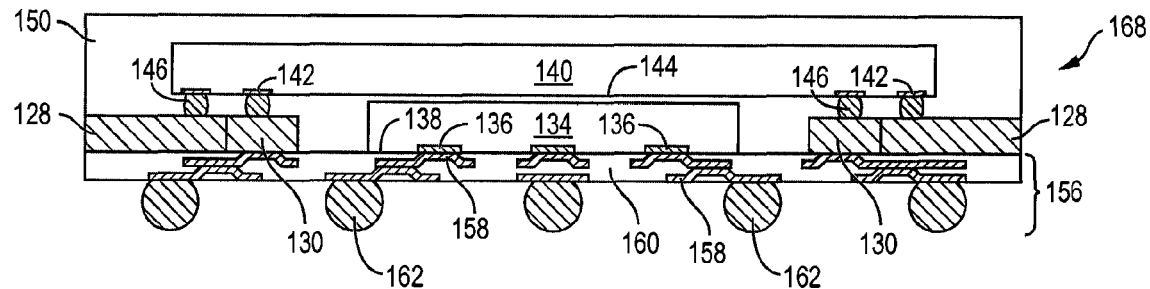
FIG. 7 illustrates a FO-WLCSP with the leadframe contact pads for electrical interconnect of the stacked semiconductor die.

FIG. 7 shows FO-WLCSP 168 after singulation. Semiconductor die 140 is electrically connected through bumps 146, contact pads 128 and 130, and interconnect structure 156 to semiconductor die 134 and bumps 162. Semiconductor die 134 and 140 are electrically connected with a single interconnect structure 156 and leadframe contact pads 128 and 130. Leadframe 124 provides stiffness for package integrity and robustness, and acts as level compensator between semiconductor die 140 and interconnect structure 156. The process described in FIGS. 6a-6p involves less cost with less time to electrically interconnect semiconductor die 134 and 140 in a robust manner, and does so without necessarily forming deep vias through the encapsulant or fine top die placement, as described in the background.

Figure 8:
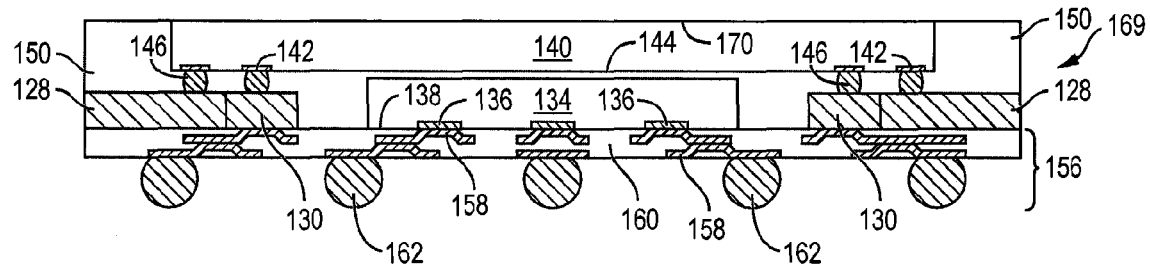
FIG. 8 illustrates the back surface of the top semiconductor die exposed.

FIG. 8 shows an embodiment of WLCSP 169, continuing from FIG. 7, with a portion of encapsulant 150 removed to expose back surface 170 of semiconductor die 140. Encapsulant 150 and back surface 170 can be planarized with a grinder or etching process. Alternatively, the deposition of encapsulant 150 is controlled to deposit the proper amount to leave back surface 170 of semiconductor die 140 exposed.

Figure 9:
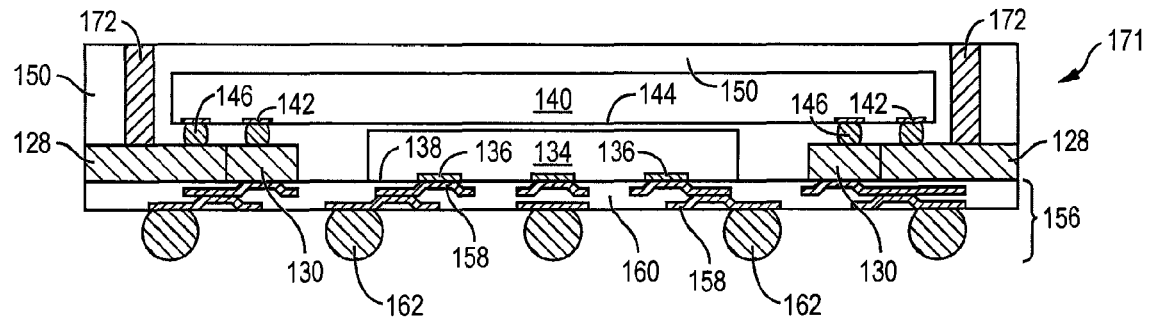
FIG. 9 illustrates conductive pillars formed through the encapsulant.

FIG. 9 shows an embodiment of WLCSP 171, continuing from FIG. 7, with a plurality of vias formed through encapsulant 150 to contact pads 128 and 130 using mechanical drilling, laser drilling, or DRIE. The vias are filled with Al, Cu, Sn, Ni, Au, Ag, Ti, W, poly-silicon, or other suitable electrically conductive material using electrolytic plating, electroless plating process, or other suitable metal deposition process to form conductive pillars or vias 172. Alternatively, a plurality of stud bumps or solder balls can be formed within the vias. Conductive pillars or vias 172 may be formed to extend down to conductive layer 158.

Figure 10:
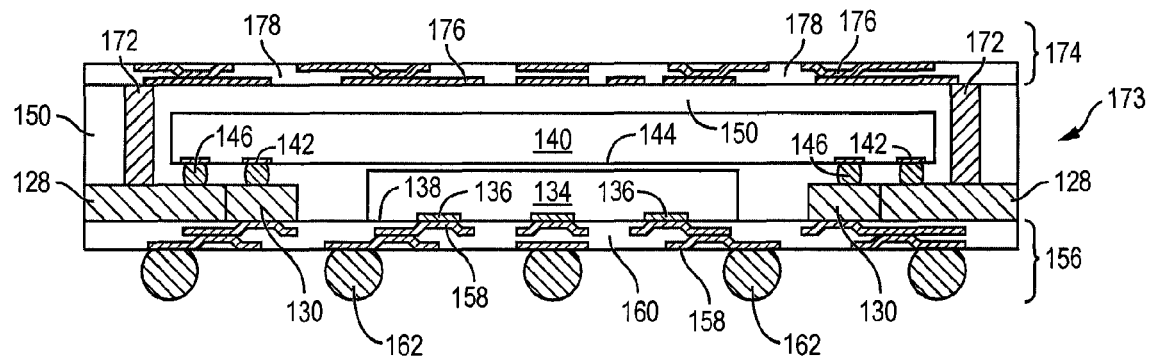
FIG. 10 illustrates a topside interconnect structure formed over the encapsulant.

FIG. 10 shows an embodiment of FO-WLCSP 173, continuing from FIG. 9, with an interconnect structure 174 formed over encapsulant 150 and conductive pillars or vias 172. The interconnect structure 174 includes an electrically conductive layer or RDL 176 formed using a patterning and metal deposition process such as sputtering, electrolytic plating, and electroless plating. Conductive layer 176 can be one or more layers of Al, Cu, Sn, Ni, Au, Ag, or other suitable electrically conductive material. One portion of conductive layer 176 is electrically connected to conductive pillars or vias 172. Other portions of conductive layer 176 can be electrically common or electrically isolated depending on the design and function of semiconductor die 134 and 140.

The interconnect structure 174 further includes an insulating or passivation layer 178 formed between conductive layers 176 for electrical isolation. The insulating layers 178 contain one or more layers of SiO2, Si3N4, SiON, Ta2O5, Al2O3, or other material having similar insulating and structural properties. The insulating layer 178 is formed using PVD, CVD, printing, spin coating, spray coating, sintering or thermal oxidation.

Figure 11:
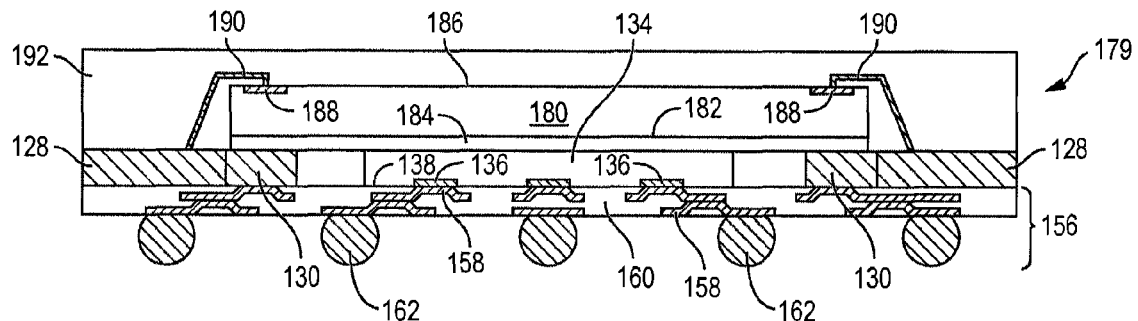
FIG. 11 illustrates bond wires electrically connected between the top semiconductor die and contact pads of the leadframe.

FIG. 11 shows an embodiment of WLCSP 179, continuing from FIG. 6h, with semiconductor die or components 180 mounted to leadframe 124 with back surface 182 oriented downward toward carrier 120. An interposing insulating layer 184 is formed between semiconductor die 180 and leadframe 124 and the back surface of semiconductor die 134. Semiconductor die 180 has an active surface 186 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 186 to implement analog circuits or digital circuits, such as DSP, ASIC, memory, or other signal processing circuit. Semiconductor die 180 may also contain IPDs, such as inductors, capacitors, and resistors, for RF signal processing. A plurality of contact pads 188 is formed over active surface 186 and electrically connected to the circuits in the active surface. Bond wires 190 are electrically connected between contact pads 188 and contact pads 128 and 130 on leadframe 124.

An encapsulant or molding compound 192 is deposited over leadframe 124 and semiconductor die 134 and 180 using a paste printing, compressive molding, transfer molding, liquid encapsulant molding, vacuum lamination, spin coating, or other suitable applicator. Encapsulant 192 can be polymer composite material, such as epoxy resin with filler, epoxy acrylate with filler, or polymer with proper filler. Encapsulant 192 is non-conductive and environmentally protects the semiconductor device from external elements and contaminants.

The interconnect structure 156 is formed over leadframe 124, encapsulant 192, and active surface 138 of semiconductor die 134, as described in FIGS. 6n-6o.

Figure 12A:
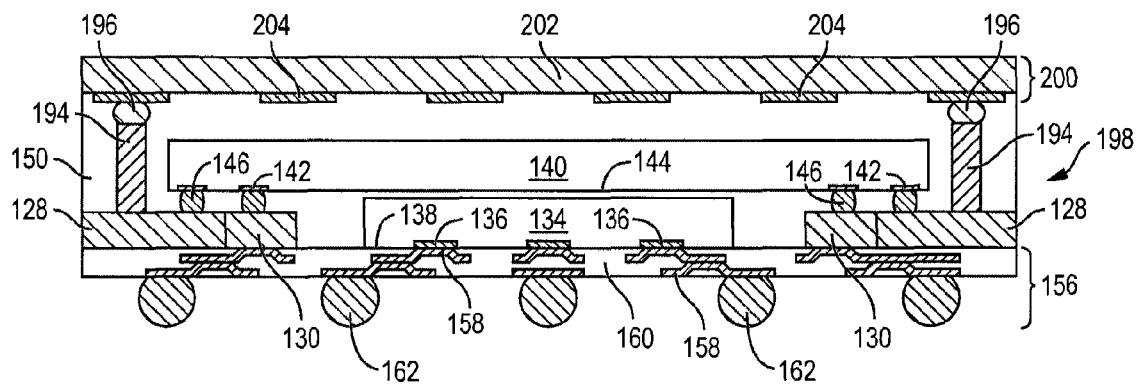
FIGS. 12a-12b illustrate a topside leadframe with integrated base and contact pads mounted to the encapsulant.

FIG. 12a shows an embodiment of WLCSP 198, continuing from FIG. 7, with a plurality of vias formed through encapsulant 150 to contact pads 128 and 130 using mechanical drilling, laser drilling, or DRIE. The vias are filled with Al, Cu, Sn, Ni, Au, Ag, Ti, W, poly-silicon, or other suitable electrically conductive material using electrolytic plating, electroless plating process, or other suitable metal deposition process to form conductive pillars or vias 194. Conductive pillars or vias 194 may be formed to extend down to conductive layer 158. A solder or conductive paste 196 is deposited over conductive pillars or vias 194. A leadframe 200 is mounted to conductive pillars or vias 194 prior to encapsulation. Leadframe 200 includes base 202 with integrated contact pads 204. After leadframe 200 is mounted, encapsulant 150 is deposited. Alternatively, leadframe 200 is mounted to encapsulant 150.

Figure 12B:
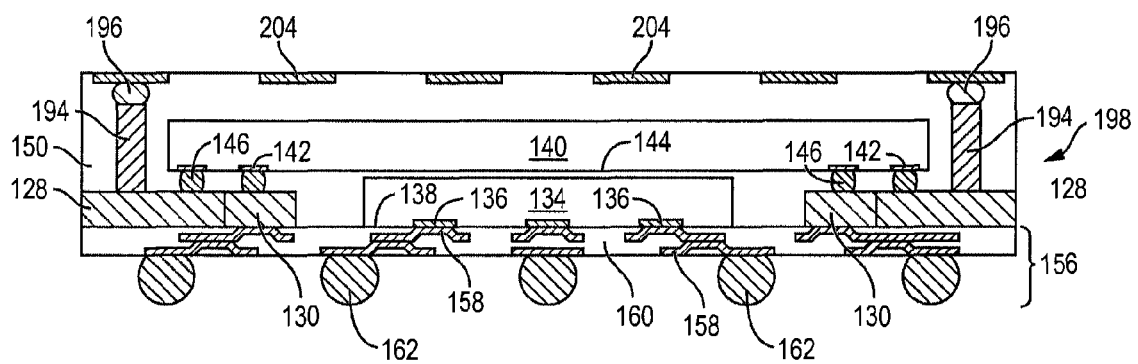

In FIG. 12*b*, base 202 is removed by grinding or etching process, leaving individual contact pads 204 embedded with encapsulant 150. Contact pads 204 are electrically connected to conductive pillars or vias 194.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
    providing a substrate including a plurality of contact pads extending laterally from the substrate;
    disposing a first semiconductor die between the contact pads of the substrate;
    disposing a second semiconductor die over the contact pads and first semiconductor die;
    depositing an encapsulant over the substrate and second semiconductor die; and
    forming a first interconnect structure over the contact pads and first semiconductor die.

2. The method of claim 1, further including forming a second interconnect structure over the encapsulant opposite the first interconnect structure.

3. The method of claim 1, further including forming a conductive layer over the encapsulant opposite the first interconnect structure.

4. The method of claim 1, further including forming a plurality of conductive vias through the encapsulant.

5. The method of claim 1, wherein the contact pads include first contact pads and second contact pads interposed between the first contact pads, the first contact pads having a length different than a length of the second contact pads.

6. The method of claim 1, further including forming a bond wire between the second semiconductor die and one of the contact pads.

7. A method of making a semiconductor device, comprising:
    providing a substrate including a plurality of conductive fingers extending into an opening of the substrate;
    disposing a first semiconductor die in the opening between the conductive fingers of the substrate; and
    disposing a second semiconductor die over the first semiconductor die and conductive fingers, wherein the conductive fingers include first conductive fingers and second conductive fingers interposed between the first conductive fingers, the first conductive fingers having a length different than a length of the second conductive fingers.

8. The method of claim 7, further including depositing an encapsulant over the substrate and second semiconductor die.

9. The method of claim 8, further including forming a first interconnect structure over the conductive fingers and first semiconductor die.

10. The method of claim 9, further including forming a second interconnect structure over the encapsulant opposite the first interconnect structure.

11. The method of claim 8, further including forming a plurality of conductive vias through the encapsulant.

12. The method of claim 8, further including planarizing the encapsulant to the second semiconductor die.

13. A method of making a semiconductor device, comprising:
    providing a substrate including a plurality of conductive fingers extending into an opening of the substrate; and
    disposing a first semiconductor die adjacent to the conductive fingers, wherein the conductive fingers include first conductive fingers and second conductive fingers interposed between the first conductive fingers, the first conductive fingers including a length different than a length of the second conductive fingers.

14. The method of claim 13, further including depositing an encapsulant over the conductive fingers.

15. The method of claim 13, further including forming a first interconnect structure over the conductive fingers and first semiconductor die.

16. The method of claim 15, further including forming a second interconnect structure over the conductive fingers opposite the first interconnect structure.

17. The method of claim 14, further including forming a conductive via through the encapsulant.

18. The method of claim 14, further including removing a portion of the encapsulant.

19. The method of claim 13, further including disposing a second semiconductor die over the first semiconductor die.

20. A semiconductor device, comprising:
    a substrate including a conductive finger extending from the substrate;
    a first semiconductor die disposed over the conductive finger; and
    a second semiconductor die disposed in an opening of the substrate.

21. The semiconductor device of claim 20, further including an encapsulant deposited over the conductive finger.

22. The semiconductor device of claim 20, further including an interconnect structure formed over the conductive finger.

23. The semiconductor device of claim 21, further including a conductive via formed through the encapsulant.

24. A semiconductor device, comprising:
    a plurality of first conductive fingers;
    a plurality of second conductive fingers interposed between the first conductive fingers and including a length different than a length of the first conductive fingers;
    a first semiconductor die disposed adjacent to the first conductive fingers and coplanar with the second conductive fingers; and
    a first interconnect structure formed over the first semiconductor die.

25. The semiconductor device of claim 24, further including a second semiconductor die disposed over the first conductive fingers.

* * * * *